(12) United States Patent
Mottaez et al.

(10) Patent No.: US 10,394,993 B2
(45) Date of Patent: Aug. 27, 2019

(54) DISCRETIZING GATE SIZES DURING NUMERICAL SYNTHESIS

(71) Applicant: Synopsys, Inc., Mountain View, CA (US)

(72) Inventors: Amir H. Mottaez, Los Altos, CA (US); Mahesh A. Iyer, Fremont, CA (US)

(73) Assignee: SYNOPSYS, INC., Mountain View, CA (US)

( * ) Notice: Subject to any disclaimer, the term of this patent is extended or adjusted under 35 U.S.C. 154(b) by 205 days.

(21) Appl. No.: 14/016,010

(22) Filed: Aug. 30, 2013

(65) Prior Publication Data
US 2015/0040090 A1 Feb. 5, 2015

Related U.S. Application Data

(60) Provisional application No. 61/860,178, filed on Jul. 30, 2013.

(51) Int. Cl.
*G06F 17/50* (2006.01)

(52) U.S. Cl.
CPC ........ *G06F 17/5072* (2013.01); *G06F 17/505* (2013.01)

(58) Field of Classification Search
USPC ........................................................ 716/134
See application file for complete search history.

(56) References Cited

U.S. PATENT DOCUMENTS

| | | | |
|---|---|---|---|
| 2005/0081175 A1* | 4/2005 | Scott et al. | 716/12 |
| 2009/0150847 A1* | 6/2009 | Morgenshtein et al. | 716/11 |

\* cited by examiner

*Primary Examiner* — Eric D Lee
(74) *Attorney, Agent, or Firm* — Park, Vaughan, Fleming & Dowler LLP; Laxman Sahasrabuddhe

(57) ABSTRACT

Systems and techniques are described for discretizing gate sizes during numerical synthesis. Some embodiments can receive an optimal input capacitance value for an input of an optimizable cell, wherein the input capacitance value is determined by a numerical solver that is optimizing the circuit design. Note that the circuit design may be optimized for different objective functions, e.g., best delay, minimal area under delay constraints, etc. Next, the embodiments can identify an initial library cell in a technology library whose input capacitance value is closest to the optimal input capacitance value. The embodiments can then use the initial library cell to attempt to identify a better (in terms of the objective function that is being optimized) library cell in the technology library. The delay computations used during this process are also minimized.

18 Claims, 5 Drawing Sheets

DISCRETIZING GATE SIZES DURING NUMERICAL SYNTHESIS

RELATED APPLICATION

This application claims priority to U.S. Provisional Patent Application No. 61/860,178, entitled "Method and apparatus for discretization in a minimal area under delay constraints numerical sizer," by the same inventors, and was filed on 30 Jul. 2013, the contents of which are herein incorporated by reference in their entirety for all purposes.

BACKGROUND

Technical Field

This disclosure relates to electronic design automation (EDA). More specifically, this disclosure relates to discretizing gate sizes during numerical synthesis.

Related Art

The goal of circuit synthesis is to convert a high-level description of a circuit design into an implementation that meets a set of timing constraints, and at the same time optionally optimizes one or more metrics, such as area, leakage power, etc.

Some circuit synthesis approaches create an initial circuit design at a given abstraction level (e.g., a logical or physical design). Next, a cell (the terms "cell" and "gate" are used interchangeably in this disclosure) is identified in the circuit design for optimization based on the metrics that are desired to be optimized. An optimal size for the identified cell is then determined by iteratively replacing the identified cell with functionally equivalent cells that have different sizes (this optimization process is also referred to as "sizing the cell," "sizing the gate," etc.). For each replacement cell size that is tried, the circuit synthesis approach updates timing information, and rejects cell sizes for which one or more timing constraints are violated. The iterative optimization process typically terminates after the optimization process has executed for a certain number of iterations or for a certain amount of time. One aspect that further makes this process computationally expensive is that modern technology libraries have many sizes associated with each gate type with carrying driving capability and/or multiple threshold voltages.

Unfortunately, such iterative trial-and-error based circuit synthesis approaches either take too long to complete and/or produce poor quality results for large circuit designs in which timing constraints are checked across many process corners and modes.

A circuit synthesis approach that is different from iterative trial-and-error approaches is described in Ivan Sutherland, Robert F. Sproull, and David Harris, *Logical Effort: Designing Fast CMOS Circuits*, Morgan Kaufmann, 1999 (hereinafter "Sutherland"). The cell delay can be represented using the following expression:

$$d = R \cdot C_o + p, \quad (1)$$

where, R is the output resistance of the cell, $C_o$ is the output loading, and p is the parasitic delay of the cell. Equation (1) can then be rewritten as:

$$d = (R \cdot C_i) \cdot \left(\frac{C_o}{C_i}\right) + p, \quad (2)$$

where, $C_i$ is the input capacitance presented by the cell at one of its input terminals.

The circuit synthesis approach described in Sutherland uses the following linear cell delay model:

$$d = g \cdot h + p, \quad (3)$$

where, g represents the logical effort, h represents the electrical effort, and p represents the parasitic delay of the cell. The logical effort captures the effect of the cell's topology on its ability to produce output current. The logical effort is independent of the size of the transistors in the circuit. The electrical effort describes how the electrical environment of the cell affects performance, and how the size of the transistors in the cell determines its load-driving capability. The parasitic delay is a form of delay overhead that accompanies any gate. The logical effort g and the parasitic delay p can be normalized, e.g., they can be normalized with respect to the logical effort and parasitic delay values, respectively, of a reference inverter. Comparing Equations (2) and (3) we note that the first term $(R \cdot C_i)$ represents the logical effort g, and the second term $$\left(\frac{C_o}{C_i}\right)$$

represents the electrical effort h.

What are needed are circuit synthesis systems and techniques that are fast and accurate.

SUMMARY

Some embodiments described herein provide techniques and systems for discretizing gate sizes during numerical synthesis. The circuit design can optimized for best delay or minimal area under delay constraints.

Some embodiments can receive an optimal input capacitance value for an input of an optimizable cell, wherein the input of the optimizable cell is driven by an output of a driver cell, and wherein the input capacitance value is determined by a numerical solver that is optimizing a circuit design for best delay. Next, the embodiments can identify a first library cell whose input capacitance value is closest to the optimal input capacitance value, wherein the first library cell is selected from a technology library. The embodiments can then compute a delay from an input of the driver cell to an output of the optimizable cell assuming the first library cell is instantiated at the optimizable cell. Next, the embodiments can identify a second library cell from the technology library, wherein the input capacitance value of the second library cell is less than or equal to the input capacitance value of the first library cell, and wherein instantiating the second library cell at the optimizable cell would improve the delay from the input of the driver cell to the output of the optimizable cell.

In some embodiments, identifying the second library cell can involve: iterating through a list of library cells that have been sorted based on input capacitance values, wherein the iteration starts with a library cell whose input capacitance value is less than the input capacitance value of the first library cell, and for each candidate library cell that is evaluated, computing the delay from the input of the driver cell to the output of the optimizable cell by assuming that the candidate library cell is instantiated at the optimizable cell. In some embodiments, computing the delay from the input of the driver cell to the output of the optimizable cell involves using the specific logical effort value and the specific parasitic delay value for the candidate library cell.

Some embodiments can receive an optimal input capacitance value for an input of an optimizable cell, wherein the input of the optimizable cell is driven by an output of a driver cell, and wherein the input capacitance value is determined by a numerical solver that is optimizing a circuit design for minimal area under delay constraints. Next, the embodiments can identify a first library cell whose input capacitance value is closest to the optimal input capacitance value, wherein the first library cell is selected from a technology library. Next, the embodiments can determine a second library cell in the technology library that has a smaller area than the first library cell, and that does not create new timing violations or worsen existing timing violations.

In some embodiments, determining the second library cell can involve the following operations. First, the embodiments can compute a first slack value at an output of the optimizable cell based on a delay from an input of the driver cell to the output of the optimizable cell assuming the first library cell is instantiated at the optimizable cell. Next, the embodiments can initialize a best discretized cell variable to be equal to the first library cell, a best area variable to be equal to the area of the first library cell, and a best slack variable to be equal to the first slack value. The embodiments can then iterate through one or more library cells lib_cell_i whose input capacitance value is less than or equal to the input capacitance value of the first library cell, and perform the following operations for each library cell lib_cell_i: compute a slack value slack_i at an output of the optimizable cell based on a delay from an input of the driver cell to the output of the optimizable cell assuming the library cell lib_cell_i is instantiated at the optimizable cell, and if slack_i is greater than the value of the best slack variable and/or the area of library cell lib_cell_i is less than the value of the best area variable, update the best discretized cell variable to be equal to lib_cell_i, the best area variable to be equal to the area of library cell lib_cell_i, and the best slack variable to be equal to slack_i.

The embodiments can then determine if the best slack variable's value is greater than or equal to zero and the best area variable's value is less than the area of the optimizable cell. If so, the embodiments can return the value of the best discretized cell variable as the second library cell. Otherwise, the embodiments can iterate through each library cell lib_cell_i whose input capacitance value is between the input capacitance value of the first library cell and the input capacitance value of the optimizable cell, and perform the following operations for each library cell lib_cell_i: compute a slack value slack_i at an output of the optimizable cell based on a delay from an input of the driver cell to the output of the optimizable cell assuming the library cell lib_cell_i is instantiated at the optimizable cell, and if slack_i is greater than the value of the best slack variable and/or the area of library cell lib_cell_i is less than the value of the best area variable, update the best discretized cell variable to be equal to lib_cell_i, the best area variable to be equal to the area of library cell lib_cell_i, and the best slack variable to be equal to slack_i. The embodiments can then return the value of the best discretized cell variable as the second library cell.

In some embodiments, values of delay components that are independent of the candidate library cell are pre-computed and reused during the iterative process. In some embodiments, computing the delay from the input of the driver cell to the output of the optimizable cell involves using one of the following wire load delay models: an Elmore wire load delay model, a balanced tree wire load delay model, a best case tree wire load delay model, and a worst case tree wire load delay model.

DETAILED DESCRIPTION

Figure 1:
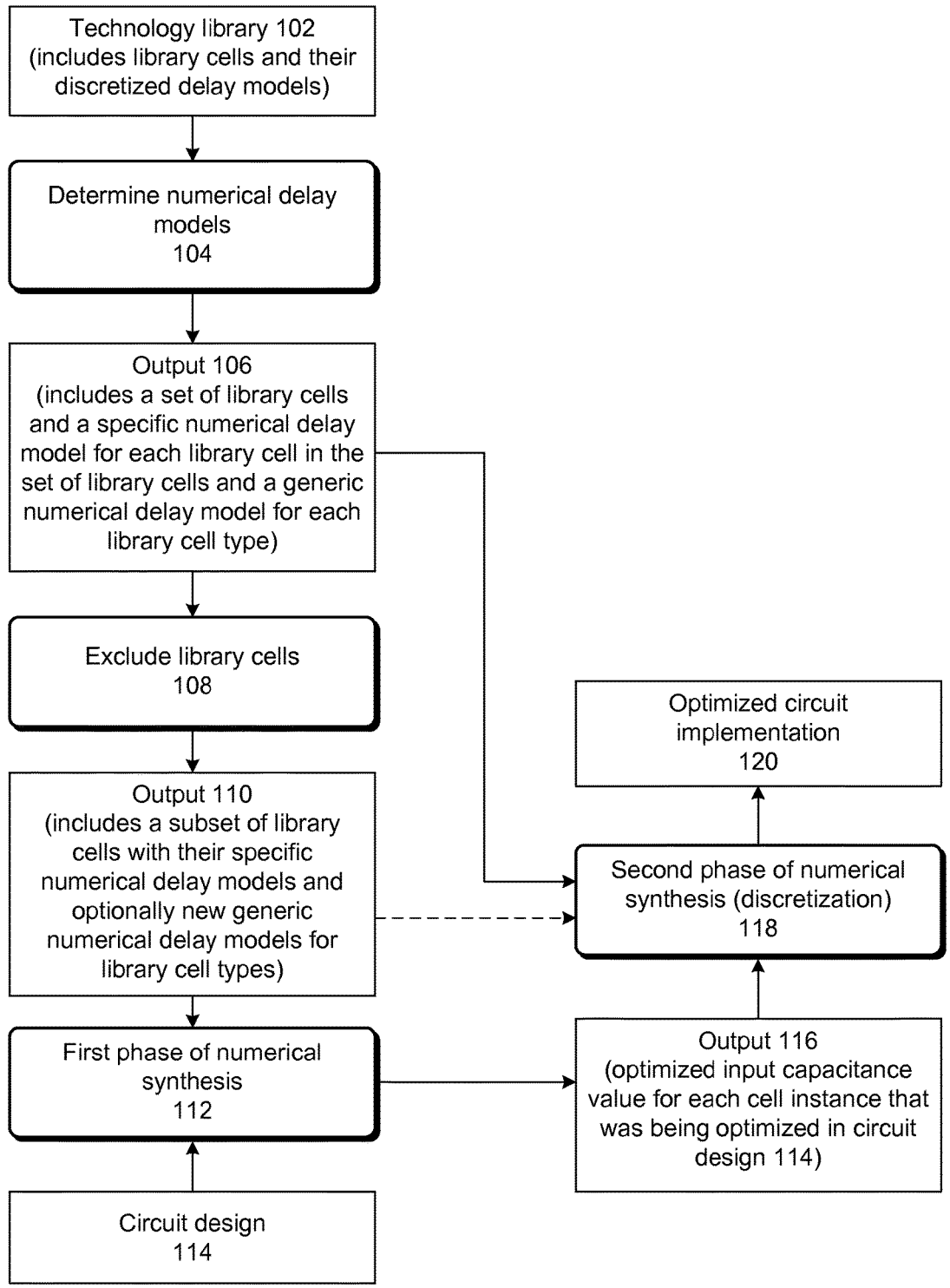
FIG. 1 illustrates a numerical synthesis process in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z.

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Numerical Synthesis

FIG. 1 illustrates a numerical synthesis process in accordance with some embodiments described herein.

Technology library 102 includes library cells and discretized non-linear delay models for the library cells. The library cells in the technology library 102 can be used to create and/or optimize a circuit design. The term "library cell" refers to a cell in a technology library. The term "library cell" is to be distinguished from the term "cell instance" which is an instantiation of a library cell in a circuit design. In some embodiments, a discretized delay model models the delay for a timing arc of a library cell.

The term "library cell type" refers to a particular logical functionality. Examples of functionalities include, but are not limited to, "AND," "OR," "XOR," "multiplexor," etc. The term "library cell" refers to a particular implementation of a library cell type. A technology library can be viewed as a collection of library cells of one or more library cell types. For example, a technology library may include multiple sizes of an inverter. In this example, the term "inverter" is the library cell type, and the term "library cell" refers to an inverter implementation of a particular size.

A numerical delay model is a delay model that can be used by a numerical solver to optimize a cost function. A linear delay model is one example of a numerical delay model. More generally, an analytical formula that represents the delay behavior is an example of a numerical delay model.

The term "specific numerical delay model" refers to a numerical delay model that models the delay behavior of a particular timing arc of a particular library cell, or the delay behavior of a particular library cell. A specific numerical delay model is defined using a specific logical effort value and a specific parasitic delay value.

The term "generic numerical delay model" refers to a numerical delay model that models an aggregated delay behavior of either a timing arc of a library cell type or the library cell type itself. A generic numerical delay model is defined using a generic logical effort value and a generic parasitic delay value.

Examples of systems and techniques that can be used to determine specific and generic numerical delay models (which can be used to perform operation 104) are described in U.S. patent application Ser. No. 13/450,178, entitled "Numerical delay model for a technology library cell and/or a technology library cell type," the contents of which are herein incorporated by reference in their entirety.

Some embodiments determine numerical delay models based on technology library 102 (operation 104). Output 106 of operation 104 can include a set of library cells and a specific numerical delay model for each library cell in the set of library cells and a generic numerical delay model for each library cell type. The set of library cells in output 106 typically includes all library cells in technology library 102, but in some embodiments certain library cells may be removed if desired.

Certain library cells can then be excluded (operation 108) to obtain a subset of library cells. Each library cell in the subset of library cells has a specific numerical delay model that was computed in operation 104. In some embodiments, a new generic numerical delay model can be determined for each cell type based on the specific numerical delay models corresponding to the subset of library cells. These generic numerical delay models are "new" because they are based on the subset of library cells as opposed to being based on the set of library cells that were used in operation 104 to determine the generic numerical delay models. Output 110, i.e., the subset of library cells with their specific numerical delay models and optionally the new generic numerical delay models for the library cell types, can then be provided as input to the first phase of numerical synthesis 112.

Examples of systems and techniques that can be used to exclude library cells (which can be used to perform operation 108) are described in U.S. patent application Ser. No. 13/479,807, entitled "Excluding library cells for delay optimization in numerical synthesis," the contents of which are herein incorporated by reference in their entirety.

The first phase of numerical synthesis 112 sizes cells in circuit design 114 using the subset of library cells with their specific numerical delay models and the new generic numerical delay models. In some embodiments, the first phase of numerical synthesis 112 models a numerical optimization problem based on circuit design 114 and the specific and generic numerical models for the subset of library cells. Output 116 from the first phase of numerical synthesis 112 includes the numerically optimized size for each cell instance in circuit design 114. Specifically, in some embodiments, output 116 includes the numerically optimized (and desired) input capacitance value for each cell instance that was being optimized in the circuit design 114. The optimization can be performed iteratively, wherein a subset of cells of circuit design 114 is optimized in each iteration.

Examples of systems and techniques that can be used to create and solve numerical circuit optimization problems are described in U.S. patent application Ser. No. 13/563,316, entitled "Optimizing a circuit design for delay using load-and-slew-independent numerical delay models," the contents of which are herein incorporated by reference in their entirety.

Output 116 is then provided as one of the inputs to the second phase of numerical synthesis (discretization) 118. The other inputs to second phase of numerical synthesis 118 include the library cells in technology library 102 and output 106 (which includes the numerical delay models that were generated by operation 104). The second phase of the numerical synthesis 118 then instantiates cells that have the numerically optimized and desired cell sizes in circuit design 114 to produce optimized circuit implementation 120 using the discrete library cells from the technology library. In particular, for each cell instance in circuit design 114, the second phase of numerical synthesis 118 selects a library cell that best matches the numerically optimized size, (if a library cell with exactly the optimized size is not available, a library cell with nearly the optimized size is selected) from the set of library cells that were part of output 106. The term "discretization" can refer to the process of selecting an actual technology library cell (or selecting a parameter value—e.g., input capacitance value—that corresponds to an actual library cell) from the technology library based on the optimized parameter value (e.g., optimized input capacitance value) that was determined by the first phase of numerical synthesis 112.

In some embodiments, second phase of numerical synthesis 118 also receives output 110 as input (shown in FIG. 1 using a dashed line). Specifically, second phase of numerical synthesis 118 uses the fact that certain cells were excluded from output 106 to determine which cells to instantiate. If the user marks certain technology library cells as "do not use" cells, then the optimization process does not use them.

The reason a subset of library cells is used in the first phase and the set of all library cells is used in the second phase is as follows. The first phase determines numerically optimized cell sizes by solving a numerical optimization problem. In this phase, it is desirable to restrict the search space to library cells that can be accurately modeled using a logical effort and parasitic delay based numerical modeling approach. Therefore, a subset of library cells is used in this phase to restrict the search space. Once the numerically optimized cell sizes have been determined, it is important to enable the circuit synthesis process to select cell instances from a wide range of library cells. Therefore, in the second phase, the restriction on the search space is relaxed and the set of library cells that was in output 106 is used.

Process for Discretizing Cell Sizes

One approach to discretization orders the functionally equivalent library cell pins by their pin capacitance. This way, given a pin of a library cell of a particular function (e.g., the first input pin of a 2-input NAND function), an ordered set (ordered by capacitance values) of library cell pins (of that function only) can be returned. This operation, i.e., the construction of this data structure, can be performed once at the beginning of the overall optimization flow. Utilizing this data structure, an input capacitance value $C_i$ in the continuous domain can be discretized by searching for a library cell whose input capacitance value ($C_d$) is closest to $C_i$, i.e., the absolute difference between the two input capacitance values ($|C_d-C_i|$) is minimized. The quality of the circuits produced by a numerical optimization system that utilizes the above discretization approach is highly dependent on the quality of the numerical delay model. Unfortunately, a numerical delay model can often deviate from the actual (non-linear) library cell delay characteristics due to various effects. Therefore, a numerical synthesis system whose output quality depends directly on the numerical delay model quality can produce sub-optimal results.

We now discuss discretization schemes that utilize more accurate library cell delay models. A numerical synthesis system that employs such a discretization scheme produces more optimal circuits. Specifically, the more accurate discretization schemes first determine a library cell with the closest input capacitance value and then determine a library cell that is in the neighborhood of the desired optimal capacitance value, but that produces better results in terms of the objective function. For example, when optimizing for best delay, the discretization process utilizes an efficient delay computation to find a library cell that produces a better delay from the input of the source/start-point cell to the output of the gate being optimized. Likewise, when optimizing for minimal area under delay constraints, the discretization process performs an efficient delay calculations to find the smallest library cell that meets the delay requirement from the input of the source/start-point cell to the output of the gate being optimized.

Figure 2:
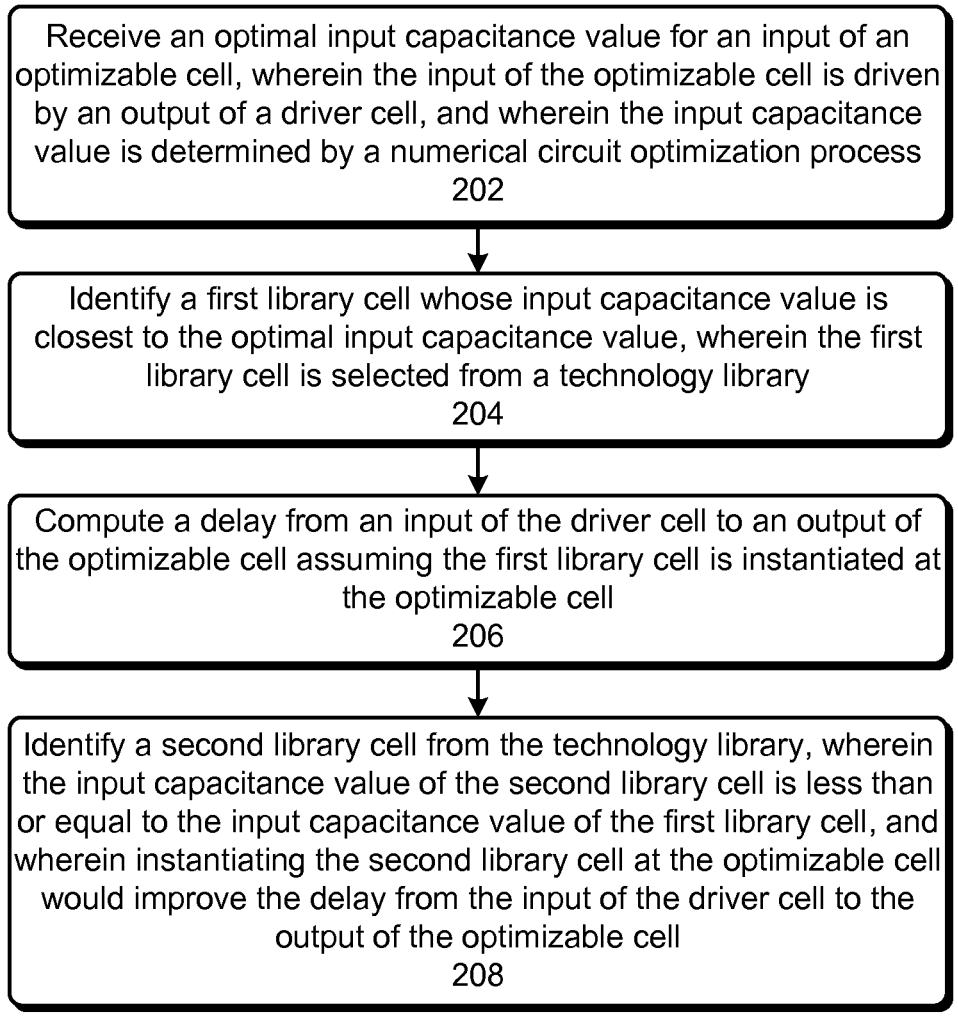
FIG. 2 illustrates a process for discretizing cell sizes when a circuit is optimized for best delay in accordance with some embodiments described herein.

FIG. 2 illustrates a process for discretizing cell sizes when a circuit is optimized for best delay in accordance with some embodiments described herein. The process can begin with a computer receiving an optimal input capacitance value for an input of an optimizable cell, wherein the input of the optimizable cell is driven by an output of a driver cell, and wherein the input capacitance value is determined by a numerical circuit optimization process (operation 202). The computer can then identify a first library cell whose input capacitance value is closest to the optimal input capacitance value, wherein the first library cell is selected from a technology library (operation 204). Next, the computer can compute a delay from an input of the driver cell to an output of the optimizable cell assuming the first library cell is instantiated at the optimizable cell (operation 206). The computer can then identify a second library cell from the technology library, wherein the input capacitance value of the second library cell is less than or equal to the input capacitance value of the first library cell, and wherein instantiating the second library cell at the optimizable cell would improve the delay from the input of the driver cell to the output of the optimizable cell (operation 208).

In order to tradeoff accuracy versus run-time, some embodiments can limit the number of library cells that are evaluated in operation 208. Note that a library cell with a smaller input capacitance generally has a worse delay, but in general improves the delay of the driver cell. Operation 208 only considers library cells with smaller input capacitance that have better delay characteristics. This guarantees that the delay of other cells that are electrically connected to the input nets of the optimizable cell are not adversely affected.

Some embodiments may allow for a very limited search for library cells that are larger than the first library cell (i.e., evaluate a few library cells in operation 208 whose input capacitance is greater than the input capacitance of the first library cell). Even though this cell may have better delay characteristics, the cell degrades the delay at its output and also degrades the delay at the output of other cells that are electrically connected to the input nets. Such embodiments may allow for a very limited degradation of the delay during discretization. Finally, note that a cell may get re-discretized for another input net. If this happens, the process can select the discrete library cell that produces the worst delay among the discretized library cells.

Figure 3A:
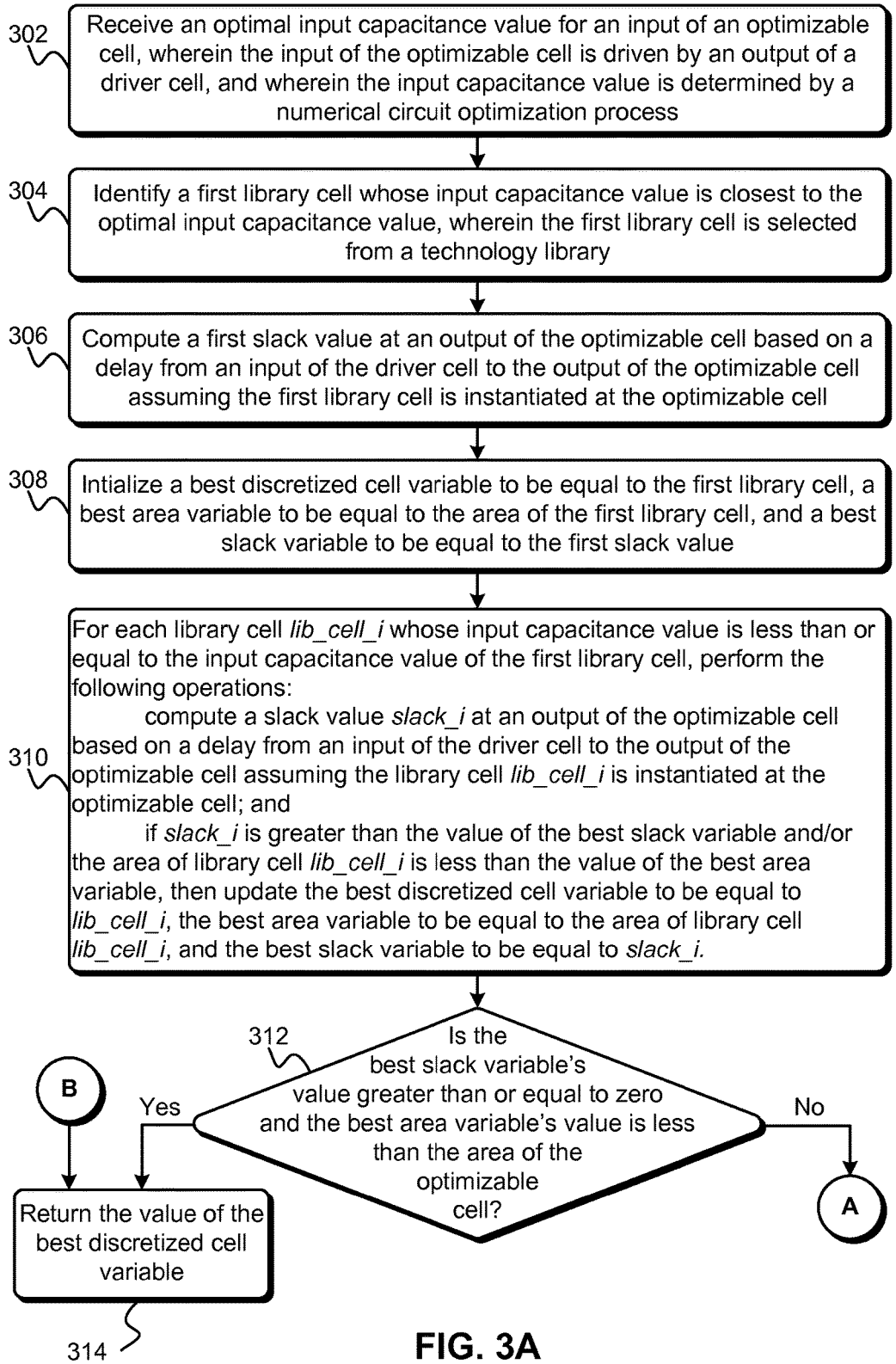
FIGS. 3A-3B illustrate a process for discretizing cell sizes when a circuit is optimized for minimal area under delay constraints in accordance with some embodiments described herein.
Figure 3B:
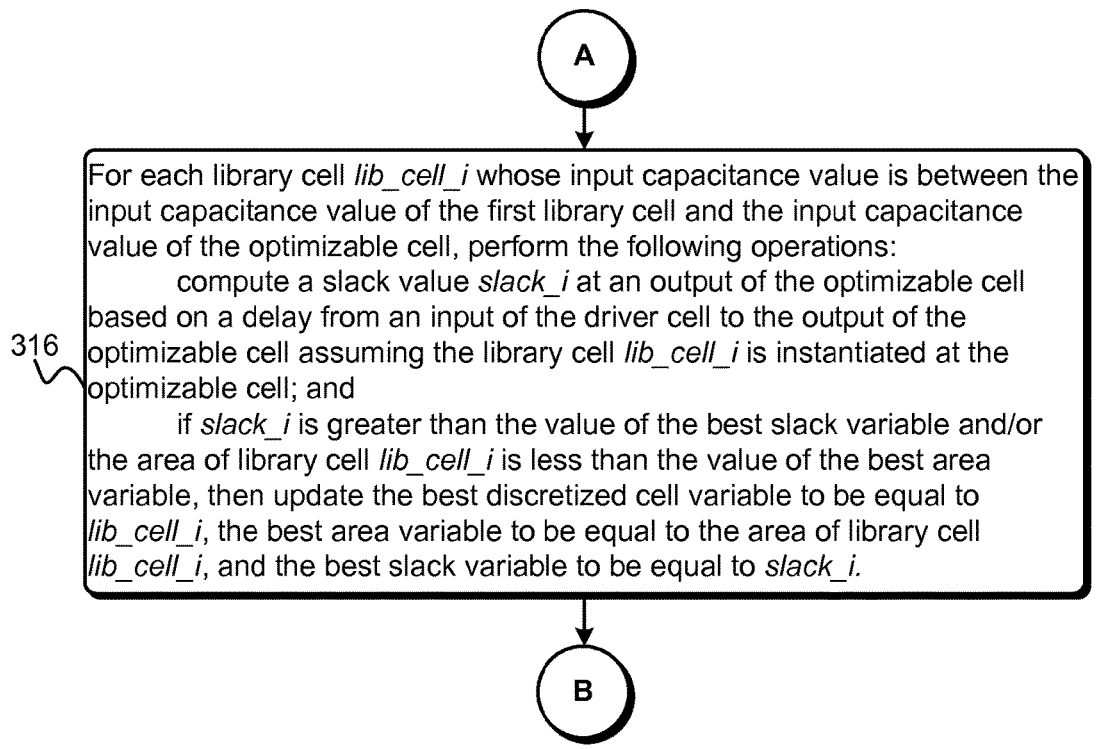

FIGS. 3A-3B illustrate a process for discretizing cell sizes when a circuit is optimized for minimal area under delay constraints in accordance with some embodiments described herein. The process can begin with a computer receiving an optimal input capacitance value for an input of an optimizable cell, wherein the input of the optimizable cell is driven by an output of a driver cell, and wherein the input capacitance value is determined by a numerical circuit optimization process (operation 302). Next, the computer can identify a first library cell whose input capacitance value is closest to the optimal input capacitance value, wherein the first library cell is selected from a technology library (operation 304). The computer can then compute a first slack value at an output of the optimizable cell based on a delay from an input of the driver cell to the output of the optimizable cell assuming the first library cell is instantiated at the optimizable cell (operation 306). Next, the computer can initialize a best discretized cell variable to be equal to the first library cell, a best area variable to be equal to the area of the first library cell, and a best slack variable to be equal to the first slack value (operation 308).

The computer can then iterate through each library cell lib_cell_i whose input capacitance value is less than or equal to the input capacitance value of the first library cell, and perform the following operations for each library cell lib- _cell_i: (a) compute a slack value slack_i at an output of the optimizable cell based on a delay from an input of the driver cell to the output of the optimizable cell assuming the library cell lib_cell_i is instantiated at the optimizable cell; and (b) if slack_i is greater than the value of the best slack variable and/or the area of library cell lib_cell_i is less than the value of the best area variable, then update the best discretized cell variable to be equal to lib_cell_i, the best area variable to be equal to the area of library cell lib_cell_i, and the best slack variable to be equal to slack_i (operation 310).

Next, the computer can check if the best slack variable's value greater than or equal to zero and the best area variable's value is less than the area of the optimizable cell (operation 312). If so, the computer can return the value of the best discretized cell variable (operation 314). If not, the computer can iterate through each library cell lib_cell_i whose input capacitance value is between the input capacitance value of the first library cell and the input capacitance value of the optimizable cell, and perform the following operations for each library cell lib_cell_i: (a) compute a slack value slack_i at an output of the optimizable cell based on a delay from an input of the driver cell to the output of the optimizable cell assuming the library cell lib_cell_i is instantiated at the optimizable cell; and (b) if slack_i is greater than the value of the best slack variable and/or the area of library cell lib_cell_i is less than the value of the best area variable, then update the best discretized cell variable to be equal to lib_cell_i, the best area variable to be equal to the area of library cell lib_cell_i, and the best slack variable to be equal to slack_i (operation 316 in FIG. 3B). The computer can then return the value of the best discretized cell variable as the discretized library cell (operation 314 in FIG. 3A).

Input Capacitance Monotonicity Check

Since the discretization processes illustrated in FIGS. 2, 3A, and 3B work on a specific input pin of the cell being discretized, we impose an additional constraint on these processes. Mainly, the pin-capacitances of any discrete library cell being considered must not be larger than the corresponding pin capacitance of the original cell (i.e., the optimizable cell). This constraint is only imposed on the pins other than the one being used for discretization to ensure that we do not degrade the delay of source drivers for these other pins (that are not currently being discretized) and the delay to the loads driven by those source drivers do not degrade during the discretization of the pin being currently optimized. Note that this constraint is already imposed on the pin that is used for discretization. As mentioned before, this constraint is important when the start-point/sources of the optimizable cell have other loads. The start-point/source cell's delay, and hence the delay of other loads of the start-point/source cell will degrade if we allow for discrete library cells with pin capacitances that are larger than the original cell's pin capacitance.

In some embodiments, this constraint can be efficiently implemented by associating a bit-vector with each discrete library cell in the sorted array of library cells. The bit-vector is in the same order as library cells in the array. For each library cell, the i-th bit of the bit-vector is set to 1 if any of the pins of that library cell is larger than the corresponding pin of the i-th library cell in the array. If we assume that the original cell's index in the array is "i", then a library cell in the array is excluded if that library cell's bit-vector has a 1 in the i-th position.

Efficient Delay Calculation

Depending on the level of accuracy that is desired, the discretization processes described in this disclosure can either use the discrete library cell's specific numerical model (i.e., specific "g" and specific "p") or perform NLDM library cell arc evaluation. Note that a discrete library cell's numerical model (specific "g"/"p") is more accurate than the overall library cell type numerical model (generic "g"/"p") that is used by the numerical circuit optimization process, and that the NLDM of the library cell is even more accurate but slower in computation.

Some embodiments use the discrete library cell's numerical model during discretization for best-delay numerical synthesis while using an NLDM-based computation for area-recovery numerical synthesis (i.e., optimizing for minimal area under delay constraints). During best-delay numerical synthesis the formulation inherently achieves optimal sizes for fastest circuit operation, and the optimal (fast) cells of the circuit operate close to the nominal slew. The specific "g"/"p" models are normally computed at nominal slew and can model the circuit speed accurately. On the other hand, area-recovery numerical synthesis down-sizes the cells up-to-the limit of the desired/required delay. Depending on the looseness of desired delay, the down-sized cells can operate at large slews that are well beyond the nominal values at which the numerical models were created. The NLDM-based delay computation can compute the slews at the start-point/source output as well as the optimized cell output and use more accurate delays at these (possibly large) slews. More importantly, the NLDM-based delay computation can account for the effect of the degraded slews at the output of the optimized/discretized cells on the down-stream logic. This can be achieved using transition-induced delay penalties as described in U.S. patent application Ser. No. 13/629,400, entitled "Modeling transition effects for circuit optimization," the contents of which are herein incorporated by reference in their entirety.

Some embodiments calculate the delay from a specific input of the start-point/source gate to the output of the optimizable gate. Other embodiments calculate the delay from all inputs of the start-point/source gate to the output of the optimizable gate. Techniques for efficiently computing the delay using numerical delay models and non-linear delay models are described below.

Numerical Delay Models

Systems and techniques for efficiently computing Elmore wire delay are described in U.S. patent application Ser. No. 13/485,600, entitled "Incremental Elmore delay calculation," the contents of which are herein incorporated by reference in their entirety. Further details on the notation used below can be found in U.S. patent application Ser. No. 13/485,600.

Figure 4A:
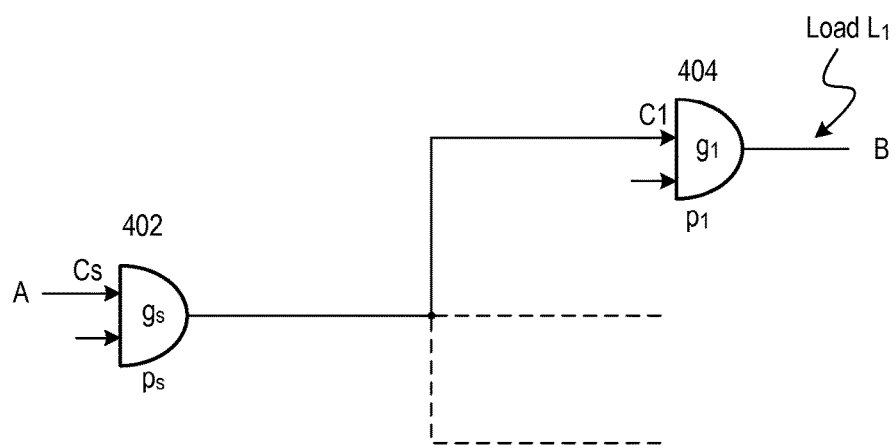
FIG. 4A illustrates delay computation using numerical delay models in accordance with some embodiments described herein.

FIG. 4A illustrates delay computation using numerical delay models in accordance with some embodiments described herein. Cell 402 is the driver or source cell, and cell 404 is the optimizable cell. Output of cell 402 is electrically connected to an input of cell 404, and may be electrically connected to the inputs of one or more other cells as illustrated by the dashed line. The delay $D_1$ from input pin A of cell 402 to the output pin B of cell 404 can be expressed as follows:

$$D_1 = K + \frac{g_s}{C_s} \cdot C_1 + r_1 \cdot C_1 + \frac{g_1}{C_1} \cdot L_1 + p_1, \qquad (4)$$

where $$K = \frac{g_s}{C_s} \cdot \left( C_W + \sum_{i \neq 1} C_i \right) + \sum_{i \neq 1} (r_i \cdot C_i) + \tau_1 + p_s. \qquad (5)$$

In Equations (4)-(5), each "$r_i$" value is a sum of the wire resistances in the Elmore wire delay model from the source gate to sink "i" (i.e., gates that are electrically connected to the dashed lines in FIG. 4A), and $\tau_i$ is an element of the $\tau$ vector as explained in U.S. patent application Ser. No. 13/485,600 (note that in U.S. patent application Ser. No. 13/485,600, the matrix element "B1i" corresponds to "$r_i$"). Note that K is a constant, i.e., the value of K is independent of the library cells that are evaluated as replacements for optimizable cell 404. Therefore, the value of K can be computed once at the beginning, and then reused for each library cell that is evaluated. In some embodiments, the value of K is ignored (i.e., only the terms other than K in Equation (4) are evaluated and compared with the corresponding value for the best cell) while different library cells are being evaluated. Once the best library cell has been identified, then the value of K can be used to compute the $D_1$ value. During minimal area under delay constraints optimization, the value of K can be subtracted from the required delay value, and the resulting value can be used for performing slack computations.

The expressions shown in Equations (4)-(5) are for the Elmore delay model. Delay expressions can be derived for other wire load models as special cases of Equations (4)-(5). Specifically, for the balanced tree wire load model, the delay can be expressed as follows (n is the number of nets that are being driven by the driver cell's output):

$$D_1 = K + \left(\frac{g_s}{C_s} + \frac{R_w}{n}\right) \cdot C_1 + \frac{g_1}{C_1} \cdot L_1 + p_1, \quad (6)$$

$$K = \frac{g_s}{C_s} \cdot \left(C_W + \sum_{i \neq 1} C_i\right) + \frac{R_w \cdot C_w}{n^2} + p_s.$$

For the best case tree wire load model, $R_w$ can be set to zero in Equation (6). For the worst case tree wire load model, the delay can be expressed as follows:

$$D_1 = K + \left(\frac{g_s}{C_s} + R_w\right) \cdot C_1 + \frac{g_1}{C_1} \cdot L_1 + p_1, \quad (7)$$

$$K = \left(\frac{g_s}{C_s} + R_w\right) \cdot \left(C_W + \sum_{i \neq 1} C_i\right) + p_s.$$

Non-Linear Delay Models

Figure 4B:
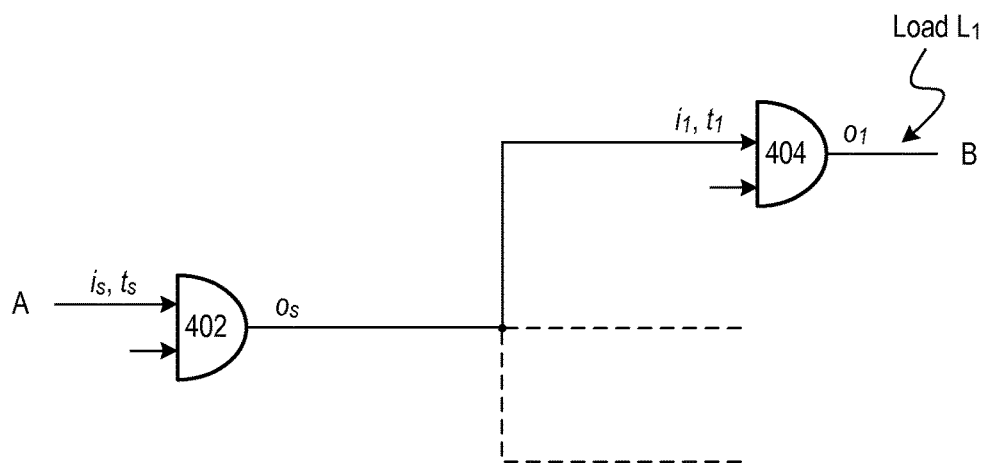
FIG. 4B illustrates delay computation using NLDMs in accordance with some embodiments described herein.

FIG. 4B illustrates delay computation using NLDMs in accordance with some embodiments described herein. The labels $i_s$, $t_s$, and $o_s$ refer to the input pin identifier of driver or source cell 402, the input transition at the input pin $i_s$ of driver or source cell 402, and the output pin identifier of driver or source cell 402, respectively. The function "d(t, i, o, l)" returns the delay (by performing an NLDM table lookup) for the arc from input "i" to output "o" based on the input transition "t" and output load "l." The function "T(t, i, o, l)" returns the output transition (by performing an NLDM table lookup) for the arc from input "i" to output "o" based on the input transition "t" and output load "l." The delay $D_1$ from input pin A of cell 402 to the output pin B of cell 404 can be expressed as follows:

$$D_1 = d\left(t_s, i_s, o_s, \sum_{i \neq 1} C_i + C_1 + C_W\right) + \sum_{i \neq 1}(r_i \cdot C_i) + \quad (8)$$

-continued
$$r_1 \cdot C_1 + \tau_1 + d\left(T\left(t_s, i_s, o_s, \sum_{i \neq 1} C_i + C_1 + C_W\right), i_1, o_1, L_1\right).$$

The expression shown in Equation (8) is for the Elmore delay model. Delay expressions can be derived for other wire load models as special cases of Equation (8). Specifically, for the balanced tree wire load model, the delay can be expressed as follows (n is the number of nets that are being driven by the driver cell's output):

$$D_1 = d\left(t_s, i_s, o_s, \sum_{i \neq 1} C_i + C_1 + C_W\right) + \frac{R_w \cdot C_w}{n^2} + \quad (9)$$

$$\frac{R_w}{n} \cdot C_1 + d\left(T\left(t_s, i_s, o_s, \sum_{i \neq 1} C_i + C_1 + C_W\right), i_1, o_1, L_1\right).$$

For the best case tree wire load model, $R_w$ can be set to zero in Equation (9). For the worst case tree wire load model, the delay can be expressed as follows:

$$D_1 = d\left(t_s, i_s, o_s, \sum_{i \neq 1} C_i + C_1 + C_W\right) + R_w \cdot \left(\sum_{i \neq 1} C_i + C_1 + C_W\right) + \quad (10)$$

$$d\left(T\left(t_s, i_s, o_s, \sum_{i \neq 1} C_i + C_1 + C_W\right), i_1, o_1, L_1\right).$$

Note that when discretizing the j-th load of the net whose sinks are being optimized, we focus on row j in the Elmore coefficient matrix (see U.S. patent application Ser. No. 13/485,600) and "$r_i$" refers the i-th element of that vector. For all wire load models, when discretizing the j-th load of the net whose sinks are being optimized, the following can be computed once at the beginning of discretization and reused when evaluating each library cell:

$$C_W + \sum_{i, i \neq j} C_i.$$

In addition, certain expressions that are specific to each wire load model can be pre-computed and reused while evaluating each library cells. Specifically, for the Elmore wire load model, the value of the following expression can be pre-computed and reused while evaluating each library cell:

$$\tau_j + \sum_{i, i \neq j}(r_i \cdot C_i).$$

For the balanced tree model, the values of the following expressions can be pre-computed and reused while evaluating each library cell:

$$\frac{R_w \cdot C_w}{n^2}$$

and $$\frac{R_w}{n}.$$

Finally, for the worst case tree wire load model, the values of the following expressions can be pre-computed and reused while evaluating each library cell:

$$R_W \cdot \left(C_W + \sum_{i, i \neq j} C_i\right)$$

and $R_W$.

The slews at the output of the start-point/source gate as well as the optimizable gate can be computed in an analogous manner to the delay evaluation shown above. Specifically, to compute the slews, the "d" function (i.e., the delay arc evaluation function) can be replaced with the "T" (i.e., the slew arc evaluation function) in Equations (8)-(10). Furthermore, wire delay is replaced by the degradation in the slew from the output of the start-point/source gate to the input of the optimizable gate, which can be computed using well-known methods (e.g., Bakoglu's method).

Note that the gates shown in FIGS. 4A-4B can have any logic functionality, i.e., the gate symbols used in FIGS. 4A-4B do not necessarily correspond to a particular logic function. Furthermore, although only two inputs and one output are shown per gate in FIGS. 4A-4B, these gates can generally have one or more inputs and one or more outputs.

Computer System

Figure 5:
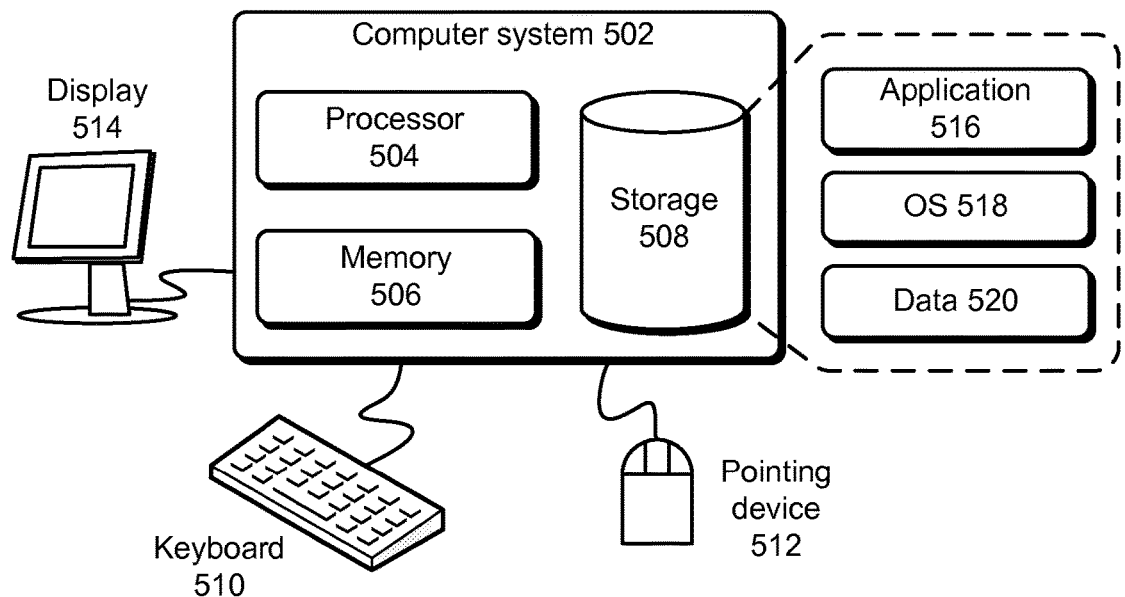
FIG. 5 illustrates a computer system in accordance with an embodiment of the present invention.

FIG. 5 illustrates a computer system in accordance with an embodiment of the present invention.

A computer or a computer system can generally be any system that can perform computations. Specifically, a computer system can be a microprocessor, an application specific integrated circuit, a distributed computing system, a cloud computing system, or any other computing system now known or later developed. Computer system 502 comprises processor 504, memory 506, and storage 508. Computer system 502 can be coupled with display 514, keyboard 510, and pointing device 512. Storage 508 can generally be any device that can store data. Specifically, a storage device can be a magnetic, an optical, or a magneto-optical storage device, or it can be based on flash memory and/or battery-backed up memory. Storage 508 can store application 516, operating system 518, and data 520.

Application 516 can include instructions that when executed by computer 502 cause computer 502 to perform one or more processes that are implicitly or explicitly described in this disclosure. Data 520 can include any data that is inputted into or outputted by application 516.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) software tool in a computer, a method for discretizing cell sizes during numerical synthesis, the method comprising:

modeling, by using the EDA software tool in the computer, a numerical optimization problem based on a circuit design and numerical models of a first set of library cells;

solving the numerical optimization problem by using a numerical solver to obtain an optimal input capacitance value for an input of an optimizable cell in the circuit design;

identifying a first library cell in the first set of library cells whose input capacitance value is closest to the optimal input capacitance value;

computing a delay from an input of a driver cell to an output of the optimizable cell assuming the first library cell is instantiated at the optimizable cell; and identifying a second library cell from a second set of library cells that includes all library cells in the first set of library cells and at least one additional library cell, wherein the input capacitance value of the second library cell is less than or equal to the input capacitance value of the first library cell, and wherein instantiating the second library cell at the optimizable cell would improve the delay from the input of the driver cell to the output of the optimizable cell.

2. The method of claim 1, wherein identifying the second library cell from the second set of library cells involves:

iterating through a list of library cells that have been sorted based on input capacitance values, wherein said iterating starts with a library cell whose input capacitance value is less than the input capacitance value of the first library cell; and for each candidate library cell that is evaluated, computing the delay from the input of the driver cell to the output of the optimizable cell by assuming that the candidate library cell is instantiated at the optimizable cell.

3. The method of claim 2, wherein computing the delay from the input of the driver cell to the output of the optimizable cell involves using a specific logical effort value and a specific parasitic delay value for the candidate library cell.

4. The method of claim 2, wherein values of delay components that are independent of the candidate library cell are pre-computed and reused during said iterating.

5. The method of claim 1, wherein computing the delay from the input of the driver cell to the output of the optimizable cell involves using one of the following wire load delay models:
an Elmore wire load delay model,
a balanced tree wire load delay model,
a best case tree wire load delay model, and
a worst case tree wire load delay model.

6. The method of claim 1, wherein the input capacitance value of the second library cell is less than or equal to the optimal input capacitance value.

7. An apparatus for discretizing cell sizes during numerical synthesis, comprising:
a processor; and
a non-transitory computer-readable storage medium storing instructions that, when executed by the processor, cause the apparatus to perform a method for discretizing cell sizes during numerical synthesis, the method comprising:
modeling, by using a computer, a numerical optimization problem based on a circuit design and numerical models of a first set of library cells;
solving the numerical optimization problem by using a numerical solver to obtain an optimal input capacitance value for an input of an optimizable cell in the circuit design;
identifying a first library cell in the first set of library cells whose input capacitance value is closest to the optimal input capacitance value;
computing a delay from an input of a driver cell to an output of the optimizable cell assuming the first library cell is instantiated at the optimizable cell; and
identifying a second library cell from a second set of library cells that includes all library cells in the first set of library cells and at least one additional library cell, wherein the input capacitance value of the second library cell is less than or equal to the input capacitance value of the first library cell, and wherein instantiating the second library cell at the optimizable cell would improve the delay from the input of the driver cell to the output of the optimizable cell.

8. The apparatus of claim 7, wherein identifying the second library cell from the second set of library cells involves:
iterating through a list of library cells that have been sorted based on input capacitance values, wherein said iterating starts with a library cell whose input capacitance value is less than the input capacitance value of the first library cell; and
for each candidate library cell that is evaluated, computing the delay from the input of the driver cell to the output of the optimizable cell by assuming that the candidate library cell is instantiated at the optimizable cell.

9. The apparatus of claim 8, wherein computing the delay from the input of the driver cell to the output of the optimizable cell involves using a specific logical effort value and a specific parasitic delay value for the candidate library cell.

10. The apparatus of claim 8, wherein values of delay components that are independent of the candidate library cell are pre-computed and reused during said iterating.

11. The apparatus of claim 7, wherein computing the delay from the input of the driver cell to the output of the optimizable cell involves using one of the following wire load delay models:
an Elmore wire load delay model,
a balanced tree wire load delay model,
a best case tree wire load delay model, and
a worst case tree wire load delay model.

12. The apparatus of claim 7, wherein the input capacitance value of the second library cell is less than or equal to the optimal input capacitance value.

13. A non-transitory computer-readable storage medium storing instructions of an electronic design automation (EDA) software tool that, when executed by a computer, cause the computer to perform a method for discretizing cell sizes during numerical synthesis, the method comprising:
modeling, by using a computer, a numerical optimization problem based on a circuit design and numerical models of a first set of library cells;
solving the numerical optimization problem by using a numerical solver to obtain an optimal input capacitance value for an input of an optimizable cell in the circuit design;
identifying a first library cell in the first set of library cells whose input capacitance value is closest to the optimal input capacitance value;
computing a delay from an input of a driver cell to an output of the optimizable cell assuming the first library cell is instantiated at the optimizable cell; and
identifying a second library cell from a second set of library cells that includes all library cells in the first set of library cells and at least one additional library cell, wherein the input capacitance value of the second library cell is less than or equal to the input capacitance value of the first library cell, and wherein instantiating the second library cell at the optimizable cell would improve the delay from the input of the driver cell to the output of the optimizable cell.

14. The non-transitory computer-readable storage medium of claim 13, wherein identifying the second library cell from the second set of library cells involves:
iterating through a list of library cells that have been sorted based on input capacitance values, wherein said iterating starts with a library cell whose input capacitance value is less than the input capacitance value of the first library cell; and
for each candidate library cell that is evaluated, computing the delay from the input of the driver cell to the output of the optimizable cell by assuming that the candidate library cell is instantiated at the optimizable cell.

15. The non-transitory computer-readable storage medium of claim 14, wherein computing the delay from the input of the driver cell to the output of the optimizable cell involves using a specific logical effort value and a specific parasitic delay value for the candidate library cell.

16. The non-transitory computer-readable storage medium of claim 14, wherein values of delay components that are independent of the candidate library cell are pre-computed and reused during said iterating.

17. The non-transitory computer-readable storage medium of claim 13, wherein computing the delay from the input of the driver cell to the output of the optimizable cell involves using one of the following wire load delay models:
- an Elmore wire load delay model,
- a balanced tree wire load delay model,
- a best case tree wire load delay model, and
- a worst case tree wire load delay model.

18. The non-transitory computer-readable storage medium of claim 13, wherein the input capacitance value of the second library cell is less than or equal to the optimal input capacitance value.

* * * * *